(12) United States Patent
Wang et al.

(10) Patent No.: US 12,745,394 B2
(45) Date of Patent: Sep. 22, 2026

(54) THREE-DIMENSIONAL MEMORY AND MANUFACTURING METHOD THEREOF

(71) Applicant: YANGTZE MEMORY TECHNOLOGIES CO., LTD., Wuhan (CN)

(72) Inventors: Qingqing Wang, Wuhan (CN); Jianlu Wang, Wuhan (CN); Wei Xu, Wuhan (CN); Ming Zeng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 740 days.

(21) Appl. No.: 18/090,416

(22) Filed: Dec. 28, 2022

(65) Prior Publication Data

US 2023/0140992 A1 May 11, 2023

Related U.S. Application Data

(63) Continuation of application No. PCT/CN2021/029763, filed on Nov. 10, 2021.

(30) Foreign Application Priority Data

Dec. 4, 2020 (CN) ......................... 202011412875.4

(51) Int. Cl.
*H10B 43/27* (2023.01)
*H10B 43/35* (2023.01)

(52) U.S. Cl.
CPC ............. *H10B 43/27* (2023.02); *H10B 43/35* (2023.02)

(58) Field of Classification Search
CPC ......... H10B 43/27; H10B 43/35; H10B 43/10
See application file for complete search history.

(56) References Cited

U.S. PATENT DOCUMENTS 9,099,347 B2 * 8/2015 Yun ........................ H10B 43/27
10,651,197 B2 * 5/2020 Hong ..................... H10B 43/27
(Continued)

FOREIGN PATENT DOCUMENTS

CN 107810554 A 3/2018
CN 110622309 A 12/2019
(Continued)

OTHER PUBLICATIONS

International Search Report issued in corresponding International Application No. PCT/CN2021/129762, mailed on Jan. 30, 2022, 7 pages.

*Primary Examiner* — Christine S. Kim
*Assistant Examiner* — Nathalie R Fayette
(74) *Attorney, Agent, or Firm* — BAYES PLLC

(57) ABSTRACT

The present disclosure relates to a three-dimensional memory and a manufacturing method thereof. The three-dimensional memory includes: a stack structure comprising a plurality of alternately stacked gate layers and dielectric layers; a plurality of channel structures vertically penetrating the stack structure; a first gate line slit structure extending along a first horizontal direction and dividing the plurality of channel structures into two memory blocks, wherein the first gate line slit structure is partitioned by a plurality of first isolation regions into a plurality of first gate line slit sub-structures; and a plurality of first connection structures each connecting, along the first horizontal direction, adjacent first gate line slit sub-structures partitioned by one first isolation region.

20 Claims, 8 Drawing Sheets

(56) References Cited

U.S. PATENT DOCUMENTS

| | | | | |
|---|---|---|---|---|
| 10,991,717 | B2 * | 4/2021 | Baek | H10B 43/40 |
| 2018/0366482 | A1 | 12/2018 | Zhou et al. | |
| 2020/0194455 | A1 * | 6/2020 | Cho | H10B 41/35 |

FOREIGN PATENT DOCUMENTS

| | | | |
|---|---|---|---|
| CN | 111052381 | A | 4/2020 |
| CN | 111668228 | A | 9/2020 |
| CN | 111819691 | A | 10/2020 |
| CN | 112234066 | A | 1/2021 |
| CN | 112289799 | A | 1/2021 |
| CN | 112530966 | A | 3/2021 |

* cited by examiner

Fig. 1 – Prior Art

THREE-DIMENSIONAL MEMORY AND MANUFACTURING METHOD THEREOF

CROSS REFERENCE OF RELATED APPLICATIONS

This application is a continuation of International Application No. PCT/CN2021/129763, filed on Nov. 10, 2021, which claims the benefit of priority to China Patent Application No. 202011412875.4 and the filing date of Dec. 4, 2020, both of which are incorporated herein by reference in their entireties.

TECHNICAL FIELD

The present disclosure relates to the manufacturing field of integrated circuits, and in particular to a three-dimensional memory with a widened and reinforced structure and a manufacturing method thereof.

BACKGROUND

In order to overcome the limitation of two-dimensional memory devices, the industry has developed memory devices with three-dimensional (3D) structure, which can improve the integration by arranging memory cells on the substrate in three dimensions. The number of layers of a three-dimensional memory increases gradually from 32 to 128 or even more than 200. The higher the number of layers, the greater the risk of the three-dimensional memory collapses. When the stack structure in the three-dimensional memory collapses, it will lead to problems such as misalignment among film layers and a conductive contact incapable of being accurately connected to a corresponding functional layer, resulting in the decline of device performance and seriously damaging the three-dimensional memory.

SUMMARY

The technical problem to be solved by the present disclosure is to provide a three-dimensional memory with a widened and reinforced structure and a manufacturing method thereof.

The technical solution adopted by the present disclosure to solve the above technical problems is a three-dimensional memory including: a substrate on which a stack structure of gate layers and dielectric layers stacked alternately is formed; a plurality of channel structures vertically passing through the stack structure and reaching into the substrate; a first gate line slit structure extending along a first direction and dividing the plurality of channel structures into at least two memory blocks, wherein the first gate line slit structure includes a first isolation region, and the first isolation region partitions the first gate line slit structure to form a plurality of first gate line slit sub-structures; a first connection structure connecting, along the first direction, the adjacent first gate line slit sub-structures partitioned by the first isolation region.

In one implementation of the present disclosure, the three-dimensional memory further includes: a second gate line slit structure in the memory block, wherein the second gate line slit structure extends along the first direction and divides the plurality of channel structures in the memory block into at least two memory fingers, the second gate line slit structure includes a second isolation region, and the second isolation region partitions the second gate line slit structure to form a plurality of second gate line slit sub-structures; and a second connection structure connecting, along the first direction, the adjacent second gate line slit sub-structures partitioned by the second isolation region.

In one implementation of the present disclosure, a top of the stack structure includes a top selection gate and a top selection gate cutting line extending along the first direction, and the top selection gate cutting line separates the top selection gate.

In one implementation of the present disclosure, the first isolation region includes a first partition structure formed in a top selection gate layer of the stack structure, and a depth of the first partition structure is the same as that of the top selection gate cutting line.

In one implementation of the present disclosure, the second isolation region includes a second partition structure formed in the top selection gate layer of the stack structure, and a depth of the second partition structure is the same as that of the top selection gate cutting line.

In one implementation of the present disclosure, a gate layer at a bottom of the stack structure provides a bottom selection gate; the three-dimensional memory further includes:

- a bottom selection gate cutting line extending along the first direction and passing through the bottom selection gate in the first isolation region, the bottom selection gate cutting line separates the bottom selection gates of adjacent memory blocks.

In one implementation of the present disclosure, the bottom selection gate of the memory block is connected with a block selection terminal for selecting the memory block.

The present disclosure also provides a manufacturing method of a three-dimensional memory, and the method includes: providing a substrate and a stack structure of gate layers and dielectric layers stacked alternately, wherein the stack structure includes a plurality of channel structures which vertically pass through the stack structure and reach into the substrate; forming a first gate line slit structure in the stack structure, wherein the first gate line slit structure extends along a first direction and divides the plurality of channel structures into at least two memory blocks, the first gate line slit structure includes a first isolation region, and the first isolation region partitions the first gate line slit structure to form a plurality of first gate line slit sub-structures; forming a first connection structure connecting, along the first direction, the adjacent first gate line slit sub-structures partitioned by the first isolation region.

In one implementation of the present disclosure, the method further includes: forming a second gate line slit structure in the stack structure, wherein the second gate line slit structure extends along the first direction and divides the plurality of channel structures in the memory block into at least two memory fingers, the second gate line slit structure includes a plurality of second isolation regions partitioning the second gate line slit structure to form a plurality of second gate line slit sub-structures; and forming a second connection structure connecting, along the first direction, the adjacent second gate line slit sub-structures partitioned by the second isolation regions.

In one implementation of the present disclosure, the method further includes: forming a top selection gate cutting line extending along the first direction with a gate layer at a top of the stack structure providing a top selection gate, wherein the top selection gate cutting line separates the top selection gate; and forming a first partition structure in the top selection gate at the top of the stack structure of the first isolation region, a depth of the first partition structure is the same as that of the top selection gate cutting line.

In one implementation of the present disclosure, the method further includes: forming a top selection gate cutting line extending along the first direction with a gate layer at a top of the stack structure providing a top selection gate, wherein the top selection gate cutting line separates the top selection gate; and forming a second partition structure in the top selection gate at the top of the stack structure of the second isolation region, a depth of the second partition structure is the same as that of the top selection gate cutting line.

In one implementation of the present disclosure, a gate layer at a bottom of the stack structure provides a bottom selection gate, the manufacturing method further includes: forming a bottom selection gate cutting line passing through the bottom selection gate in the first isolation region, the bottom selection gate cutting line separates the bottom selection gates of adjacent memory blocks.

In one implementation of the present disclosure, the method further includes: connecting the bottom selection gate of the memory block with a block selection terminal for selecting the memory block.

The present disclosure uses the first isolation region and the first connection structure in the first gate line separation groove at the junction of two memory blocks to reinforce the junction, which increases the reinforcement width compared with the reinforcement inside only one memory block, and can effectively prevent the collapse or tilt of three-dimensional memory structures of more layers. At the same time, the three-dimensional memory of the present disclosure uses the bottom selection gate cutting line to separate the bottom selection gates of adjacent memory blocks below the first isolation region of the first gate line slit structure, so that different memory blocks can be controlled respectively.

BRIEF DESCRIPTION OF THE DRAWINGS

In order to make the above objects, features and advantages of the present disclosure more obvious and understandable, the specific implementations of the present disclosure are described in detail below in conjunction with the accompanying drawings, wherein.

DETAILED DESCRIPTION

Figure 1:
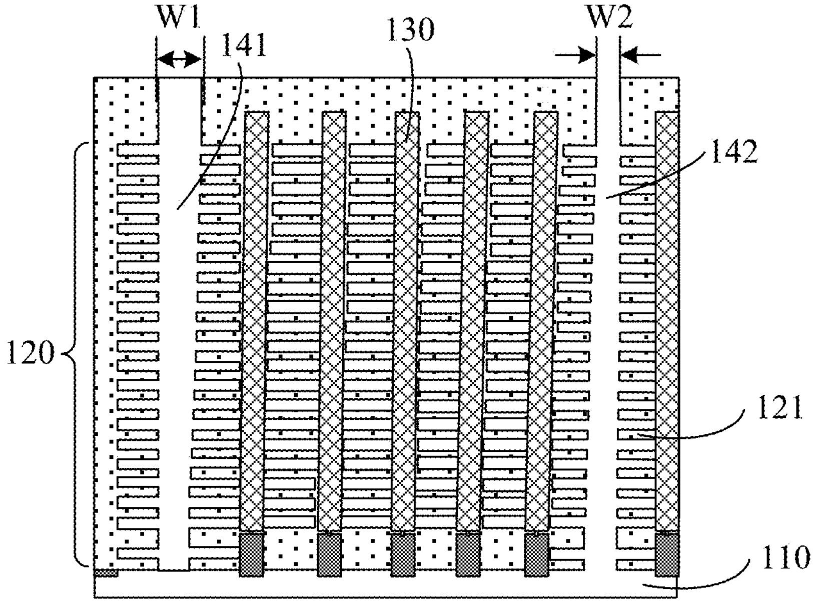
FIG. 1 is a structure schematic diagram of a three-dimensional memory.

In order to make the above objects, features and advantages of the present disclosure more obvious and understandable, the specific implementations of the present disclosure are described in detail below in conjunction with the accompanying drawings.

Many specific details are set forth in the following description to facilitate a full understanding of the present disclosure. However, the present disclosure can also be implemented in other ways different from those described herein. Therefore, the present disclosure is not limited by the specific implementations disclosed below.

As shown in the present disclosure and the claims, the words "a", "an", "one" and/or "the" are not intended to mean the singular, but may also include the plural, unless the context clearly indicates exceptions. Generally speaking, the terms "include" and "comprise" only indicate that the steps and elements that have been clearly identified are included, and these steps and elements do not constitute an exclusive list. Methods or equipment may also include other steps or elements.

When detailing the implementations of the present disclosure, for ease of illustration, the sectional view representing the device structure will be locally enlarged not according to the general scale, and the schematic diagram is only an example, which should not limit the scope of protection of the present disclosure. In addition, the actual production should include three-dimensional space dimensions of length, width and depth.

For the convenience of description, spatial relationship words such as "under", "below", "beneath", "underside", "above", "on" and so on may be used here to describe the relationship between one element or feature shown in the accompanying drawings and other elements or features. It will be understood that these spatial relationship words are intended to include directions other than those depicted in the accompanying drawings of devices in use or operation. For example, if the device in the accompanying drawing is flipped, the direction of the element described as "below" or "under" or "underside" of other elements or features will be changed to "above" of the other elements or features. Thus, the exemplary words "below" and "underside" can include up and down directions. The device may also have other orientations (rotate 90 degrees or in other directions), so the words describing the spatial relationship used here should be interpreted accordingly. In addition, it should also be understood that when a layer is called as "between" two layers, it may be the only layer between the two layers, or there may be one or more layers therebetween.

In the context of the present disclosure, the described structure of the first feature "above" the second feature may include an implementation in which the first and second features are formed in direct contact, or an implementation in which another feature is formed between the first and second features so that the first and second features may not be in direct contact.

In addition, it should be noted that the use of "first", "second" and other words to define parts and components is only for the purpose of distinguishing corresponding parts and components. Unless otherwise stated, the above words have no special meaning, so they cannot be understood as limitation to the scope of protection of the present disclosure.

The term "three-dimensional (3D) memory device" used herein refers to a semiconductor device having a memory cell transistor string (referred to herein as a "memory string", such as a NAND string) with a vertical orientation on a laterally oriented substrate so that the memory string extends in a vertical direction relative to the substrate. As used herein, the term "vertical/vertically" refers to a lateral surface that is nominally perpendicular to the substrate.

The term "substrate" used herein refers to a material on which subsequent material layers are added. The substrate itself can be patterned. The material added to the top of the substrate may be patterned or may remain unpatterned. In addition, the substrate may include a variety of semiconductor materials, such as silicon, germanium, gallium arsenide, indium phosphide, and the like. Alternatively, the substrate may be made of a non-conductive material, such as glass, plastic, or sapphire wafer.

The term "layer" as used in the present disclosure refers to a material part including a region with thickness. The layer can extend over the entire substructure or superstructure, or can have a range smaller than that of the substructure or superstructure. In addition, the layer can be a region of homogenous or inhomogeneous continuous structure with a thickness less than that of the continuous structure. For example, a layer can be between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, there above, and/or there below. A layer can include multiple layers. For example, an interconnection layer may include one or more conductors and contact layers in which contacts, interconnect lines, and/or through holes are formed, and one or more dielectric layers.

A flowchart is used in the present disclosure to illustrate the operation performed by the system according to the implementation of the present disclosure. It should be understood that the preceding or following operations are not necessarily performed accurately in sequence. Instead, various steps can be processed in reverse order or simultaneously. At the same time, other operations can be added to these processes, or one or more operations can be removed from these processes.

FIG. 1 is a structure schematic diagram of a three-dimensional memory. The three-dimensional memory includes a substrate 110 and a stack structure 120 formed on the substrate 110. The stack structure 120 is originally formed of dummy gate layers and dielectric layers stacked alternately. The stack structure 120 includes a plurality of vertical channel structures 130 and gate line slit structures 141 and 142 penetrating through the stack structure 120 along a direction parallel to the word line. These vertical channel structures 130 penetrate through the stack structure 120 and reach into the substrate 110. In the process of forming a three-dimensional memory, the dummy gate layers in the stack structure 120 are removed through the gate line slit structures 141 and 142, and then gate layers are formed at the positions where the dummy gate layers are located. FIG. 1 shows the state after the dummy gate layers are removed, and the dummy gate layers adjacent to the dielectric layers 121 in the stack structure 120 have been removed. As the number of layers in the stack structure 120 increases, the stack structure 120 tilts after the support of the dummy gate layers is lost. The vertical channel structures 130 are originally perpendicular to the surface of the substrate 110, but in FIG. 1, the vertical channel structures 130 are inclined to the right. The widths of the gate line slit structures 141 and 142 that are parallel to each other are originally equal. Due to the inclination and deformation of the stack structure 120, the width W1 of the gate line slit structure 141 is significantly larger than the width W2 of the gate line slit structure 142. In the subsequent process, an array common source is formed in the gate line slit structure. When a conductive contact connected with the array common source is formed, the conductive contact cannot effectively contact the array common source due to the change of the width and position of the gate line slit structure, resulting in defects or even failure of the device.

Figure 2:
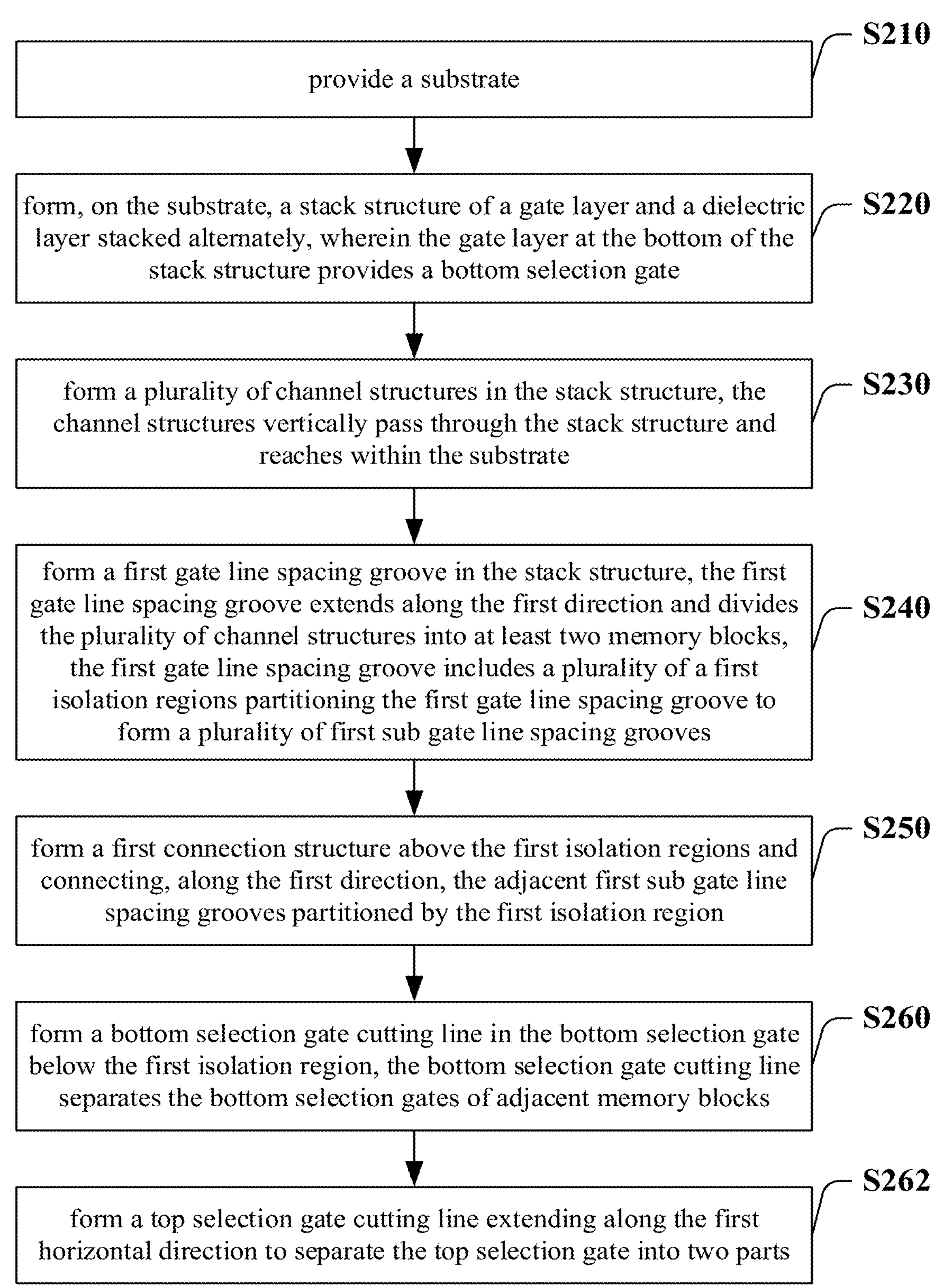
FIG. 2 is an exemplary flowchart of a manufacturing method of a three-dimensional memory according to an implementation of the present disclosure.
Figure 3:
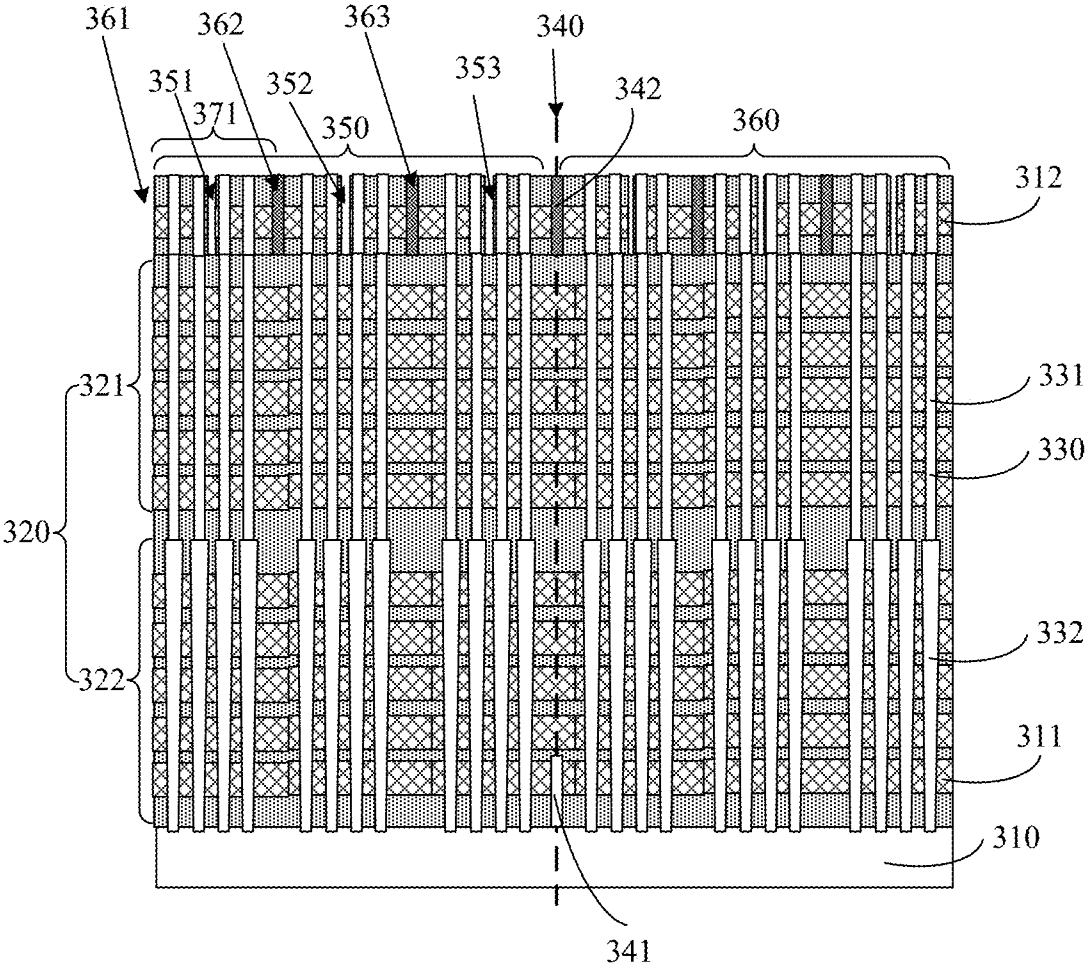
FIG. 3 is a cross-sectional schematic diagram of a three-dimensional memory according to an implementation of the present disclosure.
Figure 4:
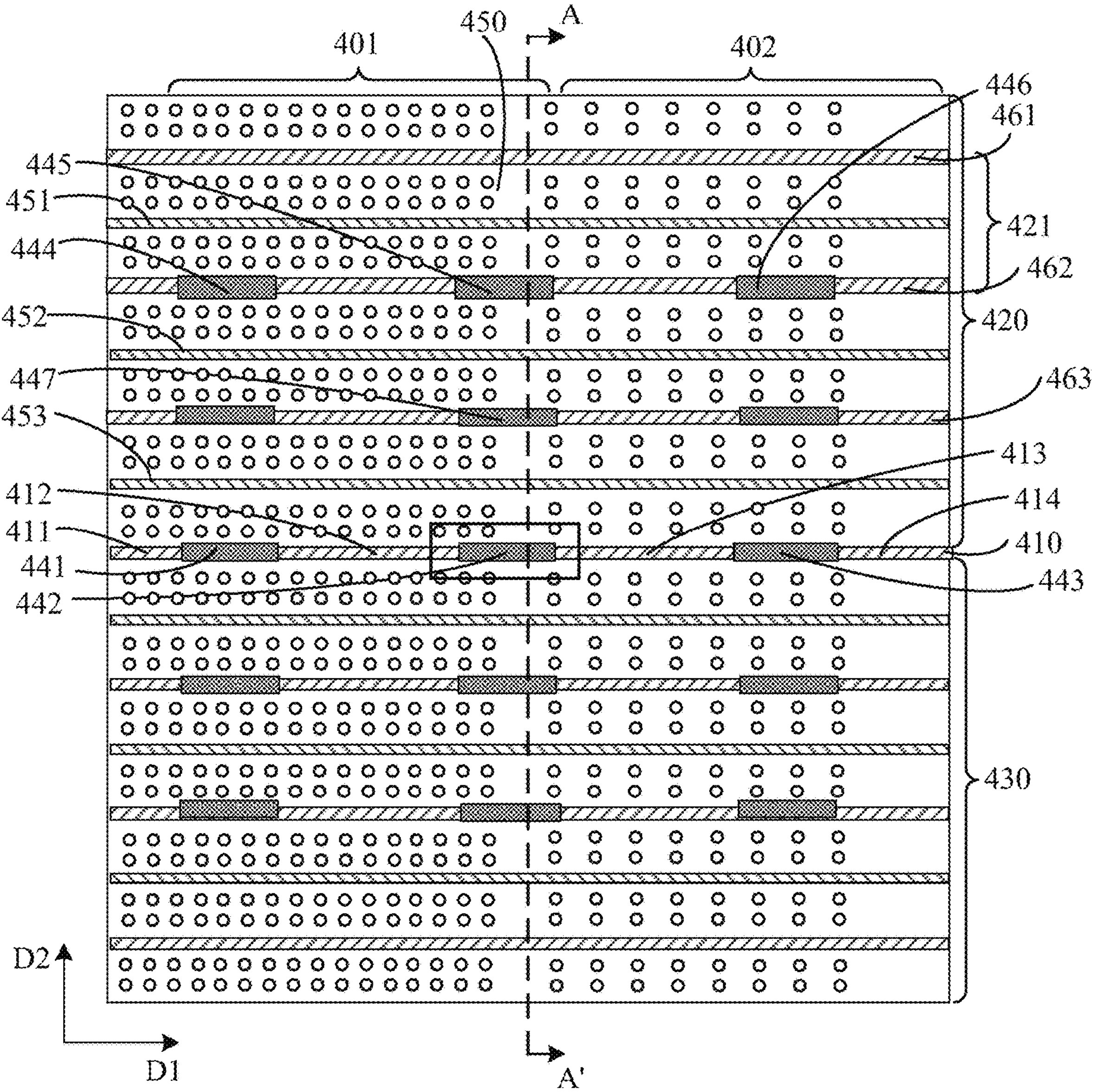
FIG. 4 is a top view structure schematic diagram of a three-dimensional memory according to an implementation of the present disclosure.

FIG. 2 is an exemplary flowchart of a manufacturing method of a three-dimensional memory according to an implementation of the present disclosure. FIG. 3 is a cross-sectional schematic diagram of a three-dimensional memory according to an implementation of the present disclosure. FIG. 4 is a top view structure schematic diagram of a three-dimensional memory according to an implementation of the present disclosure. The three-dimensional memory of the present disclosure and its manufacturing method will be described below in conjunction with FIGS. 2, 3 and 4. Referring to FIG. 2, the manufacturing method of the three-dimensional memory of this implementation includes the following steps:

Step S210: Providing a substrate and a stack structure of gate layers and dielectric layers stacked alternately, wherein a gate layer at the bottom of the stack structure provides a bottom selection gate, and the stack structure includes a plurality of channel structures which vertically pass through the stack structure and reach into the substrate.

FIG. 3 shows a sectional view of the three-dimensional memory of the implementation. In conjunction with FIG. 4, FIG. 3 is a sectional view along the AA' cutting line perpendicular to a word line in FIG. 4. Referring to FIG. 3, the three-dimensional memory includes a substrate 310. The substrate 310 may be a silicon (Si) substrate, a germanium (Ge) substrate, a silicon germanium (SiGe) substrate, a silicon on insulator (SOI), a germanium on insulator (GOI), or the like. In some implementations, the substrate 310 may also be a substrate including other element semiconductors or compound semiconductors, such as GaAs, InP, SiC, etc. It can also be a laminated structure, such as Si/SiGe and the like. Other epitaxial structures, such as silicon germanium on insulator (SGOI) and the like, may also be included. In some implementations, the substrate 310 may be made of a non-conductive material, such as glass, plastic, or sapphire wafer and the like. The substrate 310 shown in FIG. 3 may have undergone some processing, such as the formation of a common active region and cleaning.

Referring to FIG. 3, a stack structure 320 is formed above the substrate 310. The stack structure 320 may be a laminate of a first material layer and a second material layer laminated alternately. The first material layer and the second material layer may be selected from the following materials and include at least one insulating dielectric, such as silicon nitride, silicon oxide, amorphous carbon, diamond-like amorphous carbon, germanium oxide, aluminum oxide, and the like, and combinations thereof. The first material layer and the second material layer have different etching selectivity. For example, it can be a combination of silicon nitride and silicon oxide, a combination of silicon oxide and undoped polysilicon or amorphous silicon, a combination of silicon oxide or silicon nitride and amorphous carbon, etc. The deposition methods of the first material layer and the second material layer of the stack structure can include chemical vapor deposition (CVD, PECVD, LPCVD, HDPCVD), atomic layer deposition (ALD), or physical vapor deposition methods such as molecular beam epitaxy (MBE), thermal oxidation, evaporation, sputtering and various other methods. In the implementation of the present disclosure, the first material layer may be a gate layer and the second material layer may be a dielectric layer. The gate layer may be formed after the dummy gate layer is removed. The material used as the gate sacrificial layer may be, for example, a silicon nitride layer. The material used as the gate layer may be a conductive material such as the metal of tungsten, cobalt, copper, nickel, etc., or may be polysilicon, doped silicon, or any combination thereof. The materials used as the dielectric layer may be, for example, silicon oxide, aluminum oxide, hafnium oxide, tantalum oxide, etc.

In the implementation of the present disclosure, the material of the substrate 310 is, for example, silicon. The first material layer and the second material layer are, for example, a combination of silicon nitride and silicon oxide. Taking the combination of silicon nitride and silicon oxide as an example, a stack structure 320 can be formed by alternately depositing silicon nitride and silicon oxide on the substrate 310 in turn using chemical vapor deposition (CVD), atomic layer deposition (ALD) or other suitable deposition methods.

Although an exemplary configuration of the initial semiconductor structure is described herein, it is understood that one or more features may be omitted from, substituted for, or added to the semiconductor structure. For example, various well regions may be formed in the substrate as required. In addition, the materials of the layers illustrated are only exemplary, for example, the substrate 310 can also be other silicon containing substrates, such as SOI (silicon on insulator), SiGe, Si:C, etc. The gate layer can also be other conductive layers, such as the metal of tungsten, cobalt, nickel, etc. The second material layer can also be other dielectric materials, such as aluminum oxide, hafnium oxide, tantalum oxide, etc.

The present disclosure does not limit the number of layers of the stack structure 320. As shown in FIG. 3, the stack structure 320 is composed of two sub stack structures 321 and 322 superimposed. In other implementations, the stack structure 320 may be composed of a plurality of sub stack structures superimposed.

Referring to FIG. 3, in the stack structure 320, a gate layer at the bottom provides a bottom selection gate 311 for the three-dimensional memory of the present disclosure. The two layers adjacent to and on or under the bottom selection gate 311 are both dielectric layers.

Referring to FIG. 3, a plurality of channel structures 330 are formed in the stack structure 320 of the three-dimensional memory. A plurality of channel structures 330 are arranged in a three-dimensional memory according to a certain rule. The plurality of channel structures 320 vertically pass through the stack structure 320 and reach into the substrate 310.

The channel structure 330 may be formed in a channel hole that vertically passes through the stack structure 320, so the channel structure 330 may be cylindrical. The channel structure 330 may include a channel layer and a memory layer. On the whole, it is the memory layer and the channel layer that are sequentially arranged from the outside to the inside along the radial direction of the channel structure 330. The memory layer may include a blocking layer, a charge trapping layer, and a tunneling layer sequentially arranged from the outside to the inside along the radial direction of the channel structure 330. A filling layer can also be provided within the channel layer. The filling layer can act as a support. The material of the filling layer can be silicon oxide. The filling layer can be solid, and can also be hollow in the case of not affecting the reliability of the device. The formation of the channel structure 330 may be realized by using one or more film deposition processes, such as ALD, CVD, PVD, and the like or any combination thereof.

As shown in FIG. 3, since the stack structure 320 is composed of two sub stack structures 321 and 322 superimposed, the channel structure 330 is also composed of the sub channel structure 331 in the stack structure 321 and the sub channel structure 332 in the stack structure 322 connected, and there is an obvious junction region at the position where the sub channel structure 331 and the sub channel structure 332 are connected.

Step S220: Forming a first gate line slit structure in the stack structure. The first gate line slit structure extends along the first direction and divides a plurality of channel structures into at least two memory blocks. The first gate line slit structure includes a first isolation region which partitions the first gate line slit structure to form a plurality of first gate line slit sub-structures.

A three-dimensional memory generally includes several memory blocks and several memory fingers in the memory block. A memory block and a memory block, as well as a memory finger and a memory finger, are generally separated by a gate line slit structure penetrating the stack structure along the vertical direction.

In the stack structure 320 shown in FIG. 3, the first gate line slit structure 340 is in the middle of the top layer of the three-dimensional memory. The first gate line slit structure 340 is a cut extending downward from the top of the three-dimensional memory. That the first gate line slit structure 340 cuts down one layer indicates that the first gate line slit structure 340 cuts off one gate layer. The first gate line slit structure 340 divides a plurality of channel structures 330 into two memory blocks, which are respective a first memory block 350 on the left and a second memory block 360 on the right of the first gate line slit structure 340, as shown by the dot straight line in FIG. 3.

FIG. 4 shows the top of the three-dimensional memory shown in FIG. 3, that is, the structure of the top layer of the stack structure 320. Referring to FIG. 4, the first gate line slit structure 410 may correspond to the first gate line slit structure 340 shown in FIG. 3. The first gate line slit structure 410 extends along the first direction D1 and divides a plurality of channel structures into at least two memory blocks. FIG. 4 shows two memory blocks, respectively the first memory block 420 and the second memory block 430, divided by one first gate line slit structure 410.

Taking the first memory block 420 as an example, referring to FIG. 4, it includes a plurality of channel structures 450. From the point of view shown in FIG. 4, the cylindrical channel structure 450 is represented by a circular section.

FIG. 4 is not used to limit the number and distribution of channel structures included in the memory block. The first gate line slit structure 410 is between two adjacent memory blocks and at the junction of the first memory block 420 and the second memory block 430.

Referring to FIG. 4, the first gate line slit structure 410 includes a plurality of first isolation regions partitioning the first gate line slit structure 410 to form a plurality of first gate line slit sub-structures. FIG. 4 shows three first isolation regions 441, 442 and 443, which partition the first gate line slit structure 410 to form four first gate line slit sub-structures 411, 412, 413 and 414. The first isolation region 342 shown in FIG. 3 corresponds to the first isolation region 442 in FIG. 4.

It should be noted that the first gate line slit structure 410 is partitioned at the first isolation region, and at other parts, the first gate line slit structure 410 is a groove that penetrates the stack structure and reaches the substrate.

That shown in FIG. 4 is only an example and is not used to limit the specific number of the first isolation regions, the spacing between adjacent first isolation regions and the length of the first gate line slit sub-structure along the first direction D1.

In the implementation shown in FIG. 4, the first isolation region is a rectangular region extending along the first direction D1. In other implementations, the first isolation region may also be other shapes, such as square, circle, etc.

Referring to FIG. 4, the three-dimensional memory can also be divided into a core array region 401 and a connection region 402 along the first direction D1. Therein, the core array region 401 may include a plurality of channel structures as memory cells, and the connection region 402 may be a staircase region with a staircase structure. The first gate line slit structure 410 penetrates through, along the first direction D1, the core array region 401 and the connection region 402. As shown in FIG. 4, the distribution and number of channel structures in the core array region 401 and the connection region 402 are different.

Step S230: Forming a first connection structure, which connects, along the first direction, the adjacent first gate line slit sub-structures partitioned by the first isolation region.

Figure 5A:
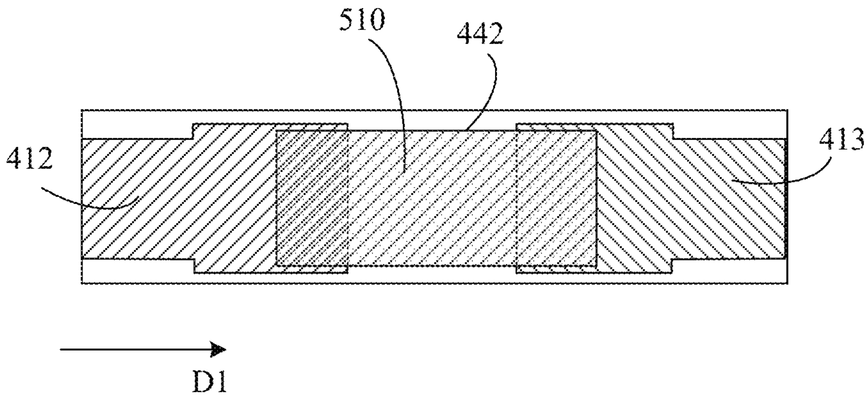
FIG. 5A is a top view schematic diagram of the block part in FIG. 4.

FIG. 5A is a top view schematic diagram of the block part in FIG. 4, showing the structure of the first isolation region 442 and its vicinity structures on the first gate line slit structure 410 in FIG. 4. Referring to FIG. 5A, the first isolation region 442 partitions the first gate line slit structure 410, forming the first gate line slit sub-structures 412 and 413. In step S230, a first connection structure 510 is formed above the first isolation region 442, and the first connection structure 510 connects, along the first direction D1, the adjacent first gate line slit sub-structures 412 and 413. By providing a first gate line slit structure between adjacent memory blocks, and providing a first isolation region and a first connection structure in the first gate line slit structure, the three-dimensional stack structure can be reinforced and the deformation of the stack structure due to stress can be reduced.

Figure 5B:
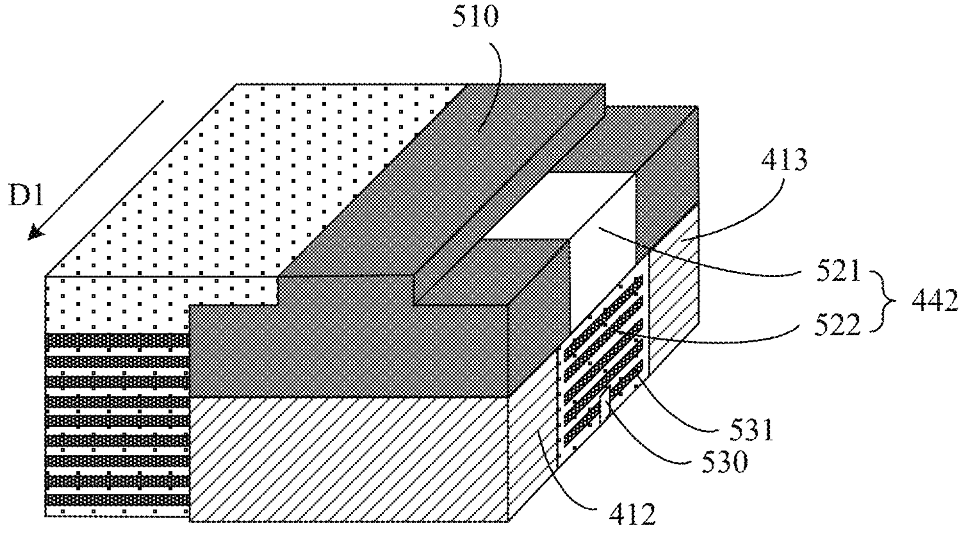
FIG. 5B is a stereo-structure schematic diagram of the block part in FIG. 4.

FIG. 5B is a stereo-structure schematic diagram of the block part in FIG. 4. Referring to FIG. 5B, the first direction D1 is the same as the extension direction of the first gate line slit structure 410, and it is the first isolation region 442 that is between the first gate line slit sub-structure 412 and the first gate line slit sub-structure 413. The first isolation region 442 includes a stack structure 522 and a first partition structure 521 above the stack structure 522, and a filling material is provided in the first partition structure 521. The stack structure 522 is a part of the stack structure 320 in FIG. 3. The gate layers in the same layer in the stack structure 522 and the stack structure 320 in FIG. 3 are connected to each other. The first isolation region 442 partitions the first gate line slit structure 410 and divides it into the first gate line slit sub-structure 412 and the first gate line slit sub-structure 413. There are filling materials in the first gate line slit sub-structures 412 and 413. A first connection structure 510 is formed above the first isolation region 442 to connect the first gate line slit sub-structure 412 and the first gate line slit sub-structure 413.

In some implementations, the first gate line slit structure 410 is filled with polysilicon, which can be used as the source structure of the three-dimensional memory. The first partition structure 521 includes one or more of silicon oxide, silicon nitride and/or silicon oxynitride. The first connection structure 510 includes a conductive material, such as tungsten.

The filled first partition structure 521 and the stack structure 320 together play a supporting role in the first gate line slit structure 410. The first gate line slit structure 410 filled with polysilicon is used as the source structure of the three-dimensional memory, and the first gate line slit sub-structures 412 and 413 filled with polysilicon can be used as the source contacts of the three-dimensional memory, respectively. The adjacent first gate line slit sub-structures 412 and 413 are in contact with each other through the first connection structure 510 and are electrically connected. According to such a structure, the source voltage can be applied to the source contact through the first connection structure 510, reducing or eliminating the use of the contact plug.

In some implementations, the first isolation region 442 is insulated from both of the first gate line slit sub-structures 412 and 413 which are partitioned by it. Referring to FIG. 5B, the part of the stack structure 522 in contact with the first gate line slit sub-structures 412 and 413 also includes a spacer layer 523. The spacer layer 523 may provide further insulation between the stack structure 522 and the adjacent first gate line slit sub-structures 412 and 413 as source contacts.

Step S240: Forming a bottom selection gate cutting line passing through the bottom selection gate in the first isolation region, which separates the bottom selection gates of adjacent memory blocks.

Referring to FIG. 3, the bottom selection gate cutting line 341 is between the first memory block 350 and the second memory block 360, extending up from above the substrate and passing through the bottom selection gate 311, so as to separate the bottom selection gates 311 of different memory blocks 350 and 360. In conjunction with FIG. 4, although the bottom selection gate cutting line 341 is not shown in FIG. 4, it can be understood that the bottom selection gate cutting line 341 is at the bottom of the first gate line slit structure 410 and is parallel to the first gate line slit structure 410. In conjunction with FIG. 5B again, the gate layer at the bottom of the stack structure 522 is a bottom selection gate 531, and a bottom selection gate cutting line 530 passes through the bottom selection gate 531 and cuts it off.

In the implementation shown in FIG. 3, the first gate layer above the substrate 310 serves as the bottom selection gate 311. In other implementations, several gate layers above the substrate 310 may be used as the bottom selection gate 311, and the bottom selection gate cutting line 341 passes through the several layers of bottom selection gates 311.

In some implementations, the bottom selection gate at the bottom of each memory block is connected with the block selection terminal, which can be used to select the memory block. The voltage can be applied to the block selection terminal to select the corresponding memory block through the bottom selection gate connected with it.

The three-dimensional memory formed by steps S210-S240 includes at least two memory blocks. The junction of the two memory blocks is reinforced, at the junction, using the first gate line slit structure, the first isolation region and the first connection structure. Compared with the reinforcement inside only one memory block, the reinforcement width is increased, which can effectively prevent the collapse or tilt of a three-dimensional memory structure of more layers. The three-dimensional memory formed according to the above method includes a plurality of memory blocks, and the bottom selection gates of adjacent memory blocks are separated by the bottom selection gate cutting line, so that different memory blocks can be controlled respectively.

In some implementations, the manufacturing method of the present disclosure further includes:

Step S250: Forming a second gate line slit structure in the stacked structure. The second gate line slit structure extends along the first direction and divides a plurality of channel structures in the memory block into at least two memory fingers, and the second gate line slit structure includes a plurality of second isolation regions partitioning the second gate line slit structure to form a plurality of second gate line slit sub-structures.

Step S260: Forming a second connection structure connecting, along the first direction, the adjacent second gate line slit sub-structures partitioned by the second isolation region.

Referring to FIG. 4, taking the first memory block 420 as an example, two second gate line slit structures 462 and 463 are formed in the first memory block 420. The two second gate line slit structures 462 and 463 divide a plurality of channel structures in the first memory block 420 into three memory fingers, and a memory finger 421 is marked in FIG. 4. One gate line slit structure 461 is further included at the border of the first memory block 420.

Referring to FIG. 4, the second gate line slit structure 462 and 463 both include three second isolation regions, in which the second isolation regions 444, 445 and 446 on the second gate line slit structure 462 and the second isolation region 447 on the second gate line slit structure 463 are marked. The second isolation region 445 on the second gate line slit structure 462 and the second isolation region 447 on the second gate line slit structure 463 cut by the AA' line are marked in FIG. 3.

The structure of the second isolation region is the same as that of the first isolation region. The previous description of the first isolation region can be used to describe the second isolation region.

The memory finger 421 shown in FIG. 4 corresponds to the memory finger 371 shown in FIG. 3. In conjunction with FIG. 3 and FIG. 4, the number of channel structures included in each memory finger may be the same.

Referring to FIG. 4, forming a second isolation region and a second connection structure on the second gate line slit structures 462 and 463 can have the effect of reinforcing, inside the memory block, the three-dimensional memory structure. A second connection structure is not formed on the gate line slit structure 461.

The second connection structure is similar to the first connection structure, except that the second connection structure is in the second isolation region in the second gate line slit structure.

According to the above steps, a second isolation region and a second connection structure are formed in the second gate line slit structure in each memory block, and the structure can be reinforced inside the memory block. Combined with the first connection structure, a reinforced structure can be formed inside each memory block and among multiple memory blocks at the same time, which can meet the structure stability requirements of the three-dimensional memory of more layers.

In some implementations, the manufacturing method of the three-dimensional memory of the present disclosure, after forming the first gate line slit structure and the first isolation region, further comprises:

Step S262: The gate layer at the top of the stack structure providing a top selection gate, forming a top selection gate cutting line extending along the first direction, and the top selection gate cutting line separating the top selection gate;

Step S264: Forming a first partition structure in the top selection gate at the top of the stack structure of the first isolation region, the depth of the first partition structure is the same as the depth of the top selection gate cutting line.

Referring to FIG. 3, the gate layer at the top of the stack structure 320 is used as the top selection gate 312 of the three-dimensional memory, and three top selection gate cutting lines 351, 352 and 353 are formed in step S262, corresponding to the top selection gate cutting lines 451, 452 and 453 shown in FIG. 4. In conjunction with FIG. 3 and FIG. 4, the top selection gate cutting lines are in the memory fingers separated by the second gate line slit structure.

The number of layers of the gate layer as the top selection gate in the stacked structure is not limited in the present disclosure. As shown in FIG. 3, one gate layer is used as the top selection gate 312. In other implementations, the 2-6 gate layers at the top of the stack structure can be used as the top selection gate, then the top selection gate cutting line cuts off the 2-6 gate layers.

Referring to FIG. 5B, the first partition structure 521 is formed in the top selection gate of the stack structure of the first isolation region 442.

In some implementations, the top selection gate cutting line and the first partition structure are formed in the same process step, which have the same depth.

In some implementations, the manufacturing method of the three-dimensional memory of the present disclosure, after the second gate line slit structure and the second isolation region are formed, further comprises:

Step S266: The gate layer at the top of the stack structure providing a top selection gate, forming a top selection gate cutting line extending along the first direction, and the top selection gate cutting line separating the top selection gate; and Step S268: Forming a second partition structure in the top selection gate at the top of the stack structure of the second isolation region, the depth of the second partition structure being the same as the depth of the top selection gate cutting line.

These implementations include a second gate line slit structure inside the memory block. The method of forming a second partition structure in the second isolation region is the same as that of forming a first partition structure in the first isolation region. Therefore, the description of the first partition structure can be used to explain the second partition structure. The structure of the second partition structure is similar to that of the first partition structure 521 and can be filled with the same material. FIG. 5B may be used to simultaneously represent the second partition structure.

In some implementations, the top selection gate cutting line and the second partition structure are formed in the same process step, which have the same depth.

In some implementations, the top selection gate cutting line, the first partition structure and the second partition structure are formed in the same process step, and the depths of the three are the same.

FIGS. 6A-6H are schematic diagrams of the process of forming a bottom selection gate cutting line in a manufacturing method of a three-dimensional memory according to an implementation of the present disclosure.

Figure 6A:
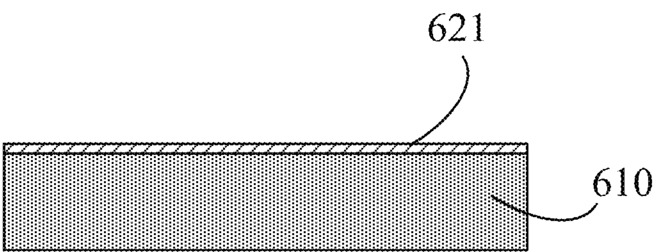
FIGS. 6A-6H are schematic diagrams of the process of forming a bottom selection gate cutting line in a manufacturing method of a three-dimensional memory according to an implementation of the present disclosure.

Referring to FIG. 6A, a substrate 610 is provided and a high temperature oxide (HTO) layer 621 is formed on the substrate 610.

Figure 6B:
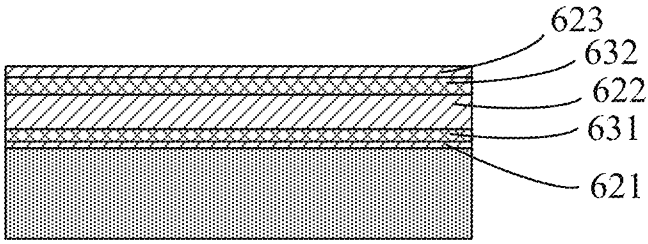

Referring to FIG. 6B, a gate layer 631 as a bottom selection gate is deposited above the high-temperature oxide layer 621. A dielectric layer 622, a gate layer 632, and a dielectric layer 623 are also formed above the gate layer 631.

The high temperature oxide layer 621, the gate layer 631, the dielectric layer 622, the gate layer 632, and the dielectric layer 623 form a stack structure above the substrate 610 in turn. It can be understood that the gate layer 632 can serve as an etching blocking layer to protect the gate layer 631.

Figure 6C:
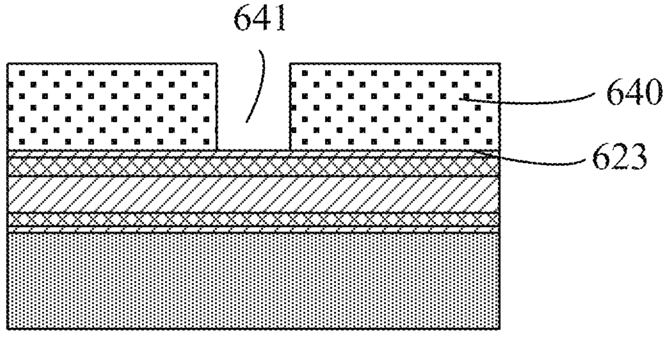

Referring to FIG. 6C, a photoresist layer 640 with a pattern 641 is formed above the dielectric layer 623 at the top. The position of the pattern 641 corresponds to the position where the top selection gate cutting line needs to be formed.

Figure 6D:
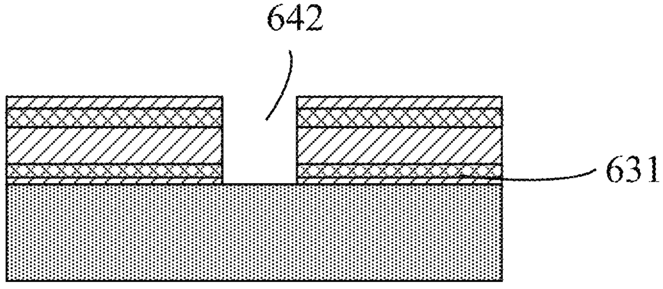

Referring to FIG. 6D, the stack structure above the substrate is etched according to the photoresist layer 640 to form the cut 642 shown in FIG. 6D. After the step shown in FIG. 6D, the gate layer 631 is cut off.

Figure 6E:
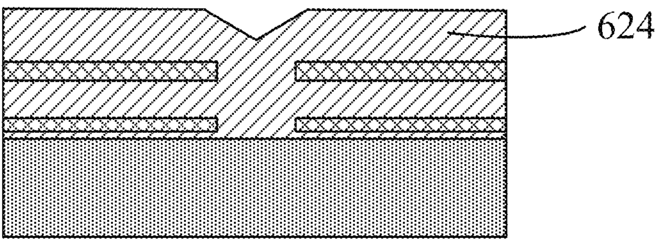

Referring to FIG. 6E, a dielectric material 624 is deposited on the structure shown in FIG. 6D so that the cut 642 is filled. This step can be performed by atomic layer deposition.

Figure 6F:
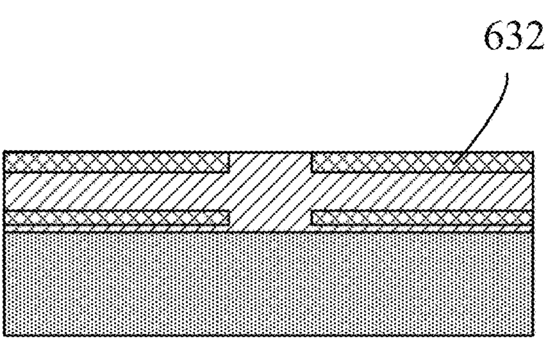

Referring to FIG. 6F, the top of the semiconductor structure shown in FIG. 6E is polished so that the upper surface of the gate layer 632 is exposed. Chemical mechanical polishing method can be used in this step.

Figure 6G:
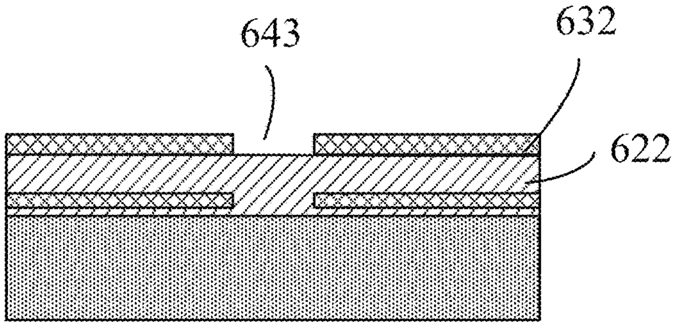

Referring to FIG. 6G, a cut 643 is formed in the gate layer 632 by wet etching. The depth of the cut 643 is the same as the thickness of the gate layer 632, so that the dielectric layer 622 below the gate layer 632 is exposed at the cut 643.

Figure 6H:
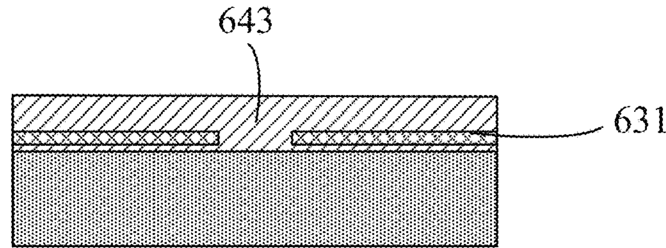

Referring to FIG. 6H, the gate layer 632 is removed.

Following FIG. 6A-6H, a bottom selection gate cut 643 is formed at the bottom selection gate 631. The formation of the stack structure of the three-dimensional memory above the semiconductor structure shown in FIG. 6H continues.

According to the manufacturing method of the three-dimensional memory of the present disclosure, two or more memory blocks can be reinforced at the same time, increasing the reinforcement width, and a bottom selection gate cut is formed in the bottom selection gate, enable the selection of different memory blocks.

The structure of the three-dimensional memory of the present disclosure can be referred to FIG. 3 and FIG. 4. The three-dimensional memory of the present disclosure can be manufactured by the manufacturing method described above, so FIG. 2 and the related description can be used to explain the three-dimensional memory of the implementation of the present disclosure.

Referring to FIG. 3, the three-dimensional memory of this implementation includes a substrate 310, a plurality of channel structures 330, a first gate line slit structure 340, a first connection structure, and a bottom selection gate cutting line 341. Therein, the stack structure 320 of the gate layer and the dielectric layer stacked alternately is formed on the substrate 310, wherein the gate layer at the bottom of the stack structure 320 provides a bottom selection gate 311. The plurality of channel structures 330 vertically pass through the stack structure 320 and reach into the substrate 310. The bottom selection gate cutting line 341 separates the bottom selection gates 311 of adjacent memory blocks.

Referring to FIG. 4, the first gate line slit structure 410 extends along the first direction D1 and divides a plurality of channel structures into at least two memory blocks 420 and 430. The first gate line slit structure 410 includes the first isolation regions 441, 442 and 443, and the first isolation regions 441, 442 and 443 partition the first gate line slit structure 410 to form a plurality of first gate line slit sub-structures 411, 412, 413 and 414.

Referring to FIGS. 4, 5A and 5B, the first connection structure 510 is above the first isolation region 442, and connects, along the first direction D1, the adjacent first gate line slit sub-structures 412 and 413 partitioned by the first isolation region 442.

In some implementations, the three-dimensional memory of the present disclosure also includes a second gate line slit structure and a second connection structure. Referring to FIG. 4, the second gate line slit structures 461, 462 and 463 are in the memory block 420, and the second gate line slit structures 461, 462 and 463 extend along the first direction D1 and divide a plurality of channel structures in the memory block 420 into at least two memory fingers. In the implementation shown in FIG. 4, the memory block 420 includes three memory fingers. Similar to the first gate line slit structure, the second gate line slit structure includes a plurality of second isolation regions, which partition the second gate line slit structure to form a plurality of second gate line slit sub-structures. The second connection structure is above the second isolation region, and connects, along the first direction D1, the adjacent second gate line slit sub-structures partitioned by the second isolation region.

In some implementations, the top of the stack structure of the three-dimensional memory of the present disclosure also includes a top selection gate and a top selection gate cutting line extending along the first direction, which separates the top selection gate.

Referring to FIG. 4, the top selection gate cutting lines 451, 452 and 453 are respectively in the three memory fingers of the memory block 420, corresponding to the top selection gate cutting lines 351, 352 and 353 shown in FIG. 3.

In some implementations, the first isolation region includes a first partition structure formed in the top selection gate layer of the stack structure, and the depth of the first partition structure is the same as the depth of the top selection gate cutting line.

In some implementations, the second isolation region includes a second partition structure formed in the top selection gate layer of the stack structure, and the depth of the second partition structure is the same as the depth of the top selection gate cutting line.

In some implementations, the bottom selection gate of the memory block is connected with the block selection terminal for selecting the memory block.

Preferably, the three-dimensional memory of the present disclosure includes two memory blocks, each memory block includes two second gate line slit structures and three memory fingers, and the area of each memory finger is equal. Referring to FIG. 4, the area of the memory finger refers to the area of the top surface of the memory finger shown in the top view. Referring to FIG. 4, the memory block 420 includes two second gate line slit structures 462 and 463. The two second gate line slit structures 462 and 463, and the gate line slit structure 461 as the border of the memory block 420 together divide the memory block 420 into three memory fingers, and the area of each memory finger is equal.

In other implementations, when the three-dimensional memory includes more than two memory blocks, for example, adding another memory block above the memory block 420 shown in FIG. 4, the gate line slit structure 461 acts as a gate line slit structure between the two memory blocks, and a second isolation region can also be formed on the gate line slit structure 461.

In some implementations, the number of rows of the channel structures between a top selection gate cutting line and the adjacent second gate line slit structure of the three-dimensional memory of the present disclosure is the same. The row here extends in the first direction D1. Referring to FIG. 3, there exist two rows of channel structures between both the top selection gate cutting lines 352 and 353 and the adjacent second gate line slit structure 363 of the three-dimensional memory of this implementation. The top selection gate cutting line is in the middle position of the memory finger where the top selection gate cutting line is located, so that the channel structures in the memory finger are symmetrically distributed with respect to the top selection gate cutting line. As shown in FIG. 3, the first gate line slit structure 340, the second gate line slit structures 362 and 363, and the gate line slit structure 361 together divide the channel structure into three parts in each memory block, and each part includes four rows of channel structures. The top selection gate cutting lines 351, 352 and 353 then divide each part into two symmetrical parts each of which includes two rows of channel structures.

FIGS. 3 and 4 are not intended to limit the specific number of channel structures. Referring to FIG. 4, a memory block is composed of three memory fingers. If the width of a memory block along the second direction D2 perpendicular to the first direction D1 is about 4.5 microns, then the width of a three-dimensional memory formed of two memory blocks is about 9 microns. In this way, the width of the reinforced three-dimensional memory becomes wider and can be used for a three-dimensional memory structure of more than 200 layers, and it is possible to prevent the structure from tilting or collapsing.

Although the present disclosure has been described with reference to the present specific implementations, those skilled in the art should recognize that the above implementations are only used to illustrate the present disclosure, and various equivalent changes or replacements can be made without departing from the spirit of the present disclosure. Therefore, as long as the changes and modifications of the above implementations are within the scope of the substantive spirit of the present disclosure, they will fall within the scope of the claims of the present disclosure.

What is claimed is:

1. A three-dimensional memory device, including:

a stack structure comprising a plurality of alternately stacked gate layers and dielectric layers;

a plurality of channel structures vertically penetrating the stack structure;

a first gate line slit structure extending along a first horizontal direction and dividing the plurality of channel structures into two memory blocks, wherein the first gate line slit structure is partitioned by a plurality of first isolation regions into a plurality of first gate line slit sub-structures;

a plurality of first connection structures each connecting, along the first horizontal direction, adjacent first gate line slit sub-structures partitioned by one of the plurality of first isolation regions;

a top selection gate in a top portion of the stack structure; and a top selection gate cutting line extending along the first horizontal direction to separate the top selection gate into two parts;

wherein the first isolation region includes a first partition structure formed in the top portion of the stack structure, and a height of the first partition structure in a vertical direction is equal to a height of the top selection gate cutting line in the vertical direction.

2. The device of claim 1, further comprising:

a second gate line slit structure extending along the first horizontal direction and dividing the plurality of channel structures in each of the two memory blocks into two memory fingers, wherein the second gate line slit structure is partitioned by a plurality of second isolation regions into a plurality of second gate line slit sub-structures; and a plurality of second connection structures each connecting, along the first horizontal direction, adjacent second gate line slit sub-structures partitioned by one of the plurality of second isolation regions.

3. The device of claim 2, wherein:

the second isolation region includes a second partition structure formed in the top portion of the stack structure; and a height of the second partition structure in the vertical direction is equal to the height of the top selection gate cutting line.

4. The device of claim 2, wherein:

each of the plurality of the first isolation regions is aligned with a corresponding one of the plurality of the second isolation regions along a second horizontal direction perpendicular to the first horizontal direction.

5. The device of claim 1, further comprising:

a bottom selection gate in a bottom portion of the stack structure; and a bottom selection gate cutting line extending along the first horizontal direction to separate the bottom selection gate into two parts.

6. The device of claim 5, further comprising:

a block selection terminal connected the bottom selection gate of each memory block for selecting the memory block.

7. The device of claim 1, wherein:

the first gate line slit structure comprises a polysilicon materiel functioned as a source of the memory device.

8. The device of claim 1, wherein:

the first connection structure comprises a conductive material; and the first partition structure comprises a dielectric material.

9. The device of claim 1, wherein:

the first connection structure is in contact with at least a top surface and a side surface of the first partition structure.

10. The device of claim 9, wherein:

the first connection structure is in contact with top surfaces of two adjacent ones of the plurality of first gate line slit sub-structures.

11. A method for fabricating a three-dimensional memory device, including:

forming a stack structure comprising a plurality of alternately stacked gate layers and dielectric layers;

forming a plurality of channel structures vertically penetrating the stack structure;

forming a first gate line slit structure extending along a first horizontal direction and dividing the plurality of channel structures into two memory blocks, wherein the first gate line slit structure is partitioned by a plurality of first isolation regions into a plurality of first gate line slit sub-structures; and forming a plurality of first connection structures each connecting, along the first horizontal direction, adjacent first gate line slit sub-structures partitioned by one of the plurality of first isolation regions;

forming a top selection gate in a top portion of the stack structure; and forming a top selection gate cutting line extending along the first horizontal direction to separate the top selection gate into two parts;

wherein forming the first isolation region comprises forming a first partition structure in the top portion of the stack structure, wherein a height of the first partition structure in a vertical direction is equal to a height of the top selection gate cutting line in the vertical direction.

12. The method of claim 11, further comprising:

forming a second gate line slit structure extending along the first horizontal direction and dividing the plurality of channel structures in each of the two memory blocks into two memory fingers, wherein the second gate line slit structure is partitioned by a plurality of second isolation regions into a plurality of second gate line slit sub-structures; and forming a plurality of second connection structures each connecting, along the first horizontal direction, adjacent second gate line slit sub-structures partitioned by one of the plurality of second isolation regions.

13. The method of claim 12, wherein forming the second isolation region comprise:

forming a second partition structure in the top portion of the stack structure, wherein a height of the second partition structure in the vertical direction is equal to the height of the top selection gate cutting line.

14. The method of claim 12, wherein:

each of the plurality of the first isolation regions is formed to align with a corresponding one of the plurality of the second isolation regions along a second horizontal direction perpendicular to the first horizontal direction.

15. The method of claim 11, further comprising:

forming a bottom selection gate in a bottom portion of the stack structure; and forming a bottom selection gate cutting line extending along the first horizontal direction to separate the bottom selection gate into two parts.

16. The method of claim 15, further comprising:

connecting the bottom selection gate of each of the two memory blocks to a block selection terminal for selecting the memory block.

17. The method of claim 11, wherein forming the first gate line slit structure comprises:

depositing a polysilicon material functioned as a source of the memory device.

18. The method of claim 11, wherein:

forming the first connection structure comprises depositing a conductive material; and forming the first partition structure comprises depositing a dielectric material.

19. The method of claim 11, wherein:

the first connection structure is formed in contact with at least a top surface and a side surface of the first partition structure.

20. The method of claim 19, wherein:

the first connection structure is formed in contact with top surfaces of two adjacent ones of the plurality of first gate line slit sub-structures.

* * * * *